(12) United States Patent
Lee et al.

(10) Patent No.: US 9,893,248 B2
(45) Date of Patent: Feb. 13, 2018

(54) SUBSTRATE FOR CHANGING COLOR OF LIGHT EMITTING DIODE AND METHOD FOR PRODUCING SAME

(71) Applicant: Corning Precision Materials Co., Ltd., Chungcheongnam-do (KR)

(72) Inventors: Ki Yeon Lee, Chungcheongnam-do (KR); Yoon Seuk Oh, Chungcheongnam-do (KR); Jhee Mann Kim, Chungcheongnam-do (KR); Hyung Soo Moon, Chungcheongnam-do (KR); Choon Bong Yang, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/304,742

(22) PCT Filed: Mar. 25, 2015

(86) PCT No.: PCT/KR2015/002900
§ 371 (c)(1),
(2) Date: Oct. 17, 2016

(87) PCT Pub. No.: WO2015/160105
PCT Pub. Date: Oct. 22, 2015

(65) Prior Publication Data
US 2017/0040507 A1 Feb. 9, 2017

(30) Foreign Application Priority Data

Apr. 17, 2014 (KR) .................. 10-2014-0045799

(51) Int. Cl.
*H01L 33/50* (2010.01)
*C03C 8/24* (2006.01)
(Continued)

(52) U.S. Cl.
CPC .............. *H01L 33/507* (2013.01); *C03C 8/24* (2013.01); *C03C 23/0025* (2013.01);
(Continued)

(58) Field of Classification Search
CPC ....... H01L 33/56; H01L 33/06; H01L 33/507; H01L 33/483
See application file for complete search history.

(56) References Cited

U.S. PATENT DOCUMENTS

| | | |
|---|---|---|
| 2013/0223922 A1 | 8/2013 | Koval et al. |
| 2014/0001485 A1 | 1/2014 | Beall et al. |
| 2014/0242306 A1 | 8/2014 | Koval et al. |

FOREIGN PATENT DOCUMENTS

| | | |
|---|---|---|
| KR | 20120009315 A | 2/2012 |
| KR | 20130009022 A | 1/2013 |

(Continued)

OTHER PUBLICATIONS

International Search Report for Application No. PCT/KR2015/002900 dated Jul. 6, 2015.

*Primary Examiner* — Amar Movva
(74) *Attorney, Agent, or Firm* — Lerner, David, Littenberg, Krumholz & Mentlik, LLP

(57) ABSTRACT

The present invention relates to a substrate for changing the color of a light emitting diode and a method for producing same and, more particularly, to a substrate for changing the color of a light emitting diode and a method for producing same, wherein the substrate may be hermetically sealed so that quantum dots (QD) contained inside may be completely protected from the outside and emission efficiency of the light emitting diode may be enhanced.

17 Claims, 6 Drawing Sheets

(51) Int. Cl.
    *C03C 23/00*     (2006.01)
    *C03C 27/10*     (2006.01)
    *H01L 33/04*     (2010.01)
    *H01L 33/48*     (2010.01)
    *H01L 33/52*     (2010.01)
    *G02F 1/1335*     (2006.01)

(52) U.S. Cl.
    CPC ........ *C03C 27/10* (2013.01); *G02F 1/133617* (2013.01); *H01L 33/04* (2013.01); *H01L 33/483* (2013.01); *H01L 33/502* (2013.01); *H01L 33/52* (2013.01); *G02F 1/133603* (2013.01); *G02F 2202/36* (2013.01); *H01L 2933/0033* (2013.01); *H01L 2933/0041* (2013.01); *H01L 2933/0058* (2013.01)

(56) References Cited

FOREIGN PATENT DOCUMENTS

| | | |
|---|---|---|
| KR | 20130110946 A | 10/2013 |
| KR | 20130121609 A | 11/2013 |
| TW | 201343594 A | 11/2013 |
| TW | 201405725 A | 2/2014 |

SUBSTRATE FOR CHANGING COLOR OF LIGHT EMITTING DIODE AND METHOD FOR PRODUCING SAME

CROSS-REFERENCE TO RELATED APPLICATION

This application is a national phase entry under 35 U.S.C. § 371 of International Application No. PCT/KR2015/002900, filed on Mar. 25, 2015, published in Korean, which claims priority to Korean Patent Application No. 10-2014-0045799, filed on Apr. 17, 2014, the disclosures of which are incorporated herein by reference.

BACKGROUND OF THE INVENTION

Field of the Invention

The present invention relates to a color conversion substrate for a light-emitting diode (LED) and a method of fabricating the same. More particularly, the present invention relates to a color conversion substrate for an LED and a method of fabricating the same able to form a hermetic seal, entirely protect a quantum dot (QD) accommodated in the LED from the external environment, and improve luminous efficiency of the LED.

Description of Related Art

A light-emitting diode (LED) is a semiconductor device formed of a compound such as gallium arsenide (GaAs) to emit light when an electrical current is applied thereto. The LED uses a p-n junction of a semiconductor into which minority carriers, such as electrons or holes, are injected, such that light is generated by the recombination of the minority carriers.

The characteristics of LEDs include low power consumption, a relatively long lifespan, the ability to be mounted in cramped spaces, and resistance to vibrations. In addition, LEDs are used in display devices and in backlight units of display devices. Recently, studies into applying LEDs to general illumination devices have been undertaken. In addition to monochromatic LEDs, such as red, blue, or green LEDs, white LEDs have come into the market. In particular, a sharp increase in demand for white LEDs is expected, since white LEDs can be applied to vehicles and lighting apparatuses.

In the field of LED technology, white light is commonly generated using two major methods. The first method to generate white light includes disposing monochromatic LEDs, such as red, green, and blue LEDs, adjacently to each other such that light emitted by the monochromatic LEDs having various colors is mixed. However, color tones may change depending on the environment in which such devices are used, since individual monochromatic LEDs have different thermal or temporal characteristics. In particular, color stains may occur, making it difficult to uniformly mix different colors of light. The second method to generate white light includes applying a fluorescent material to an LED and mixing part of initial light emitted by the LED and secondary light wavelength-converted by the fluorescent material. For example, a fluorescent material generating yellowish-green or yellow light may be used as a light excitation source on a blue LED, whereby white light can be produced by mixing blue light emitted by the blue LED and yellowish-green or yellow light excited by the fluorescent material. At present, the method of realizing white light using a blue LED and a fluorescent material is generally used.

Currently, a quantum dot (QD) generating strong light having a narrower wavelength than that of a typical fluorescent material is used as a color conversion material. In general, a QD-LED backlight generates white light by irradiating blue light emitted by a blue LED onto a yellow QD, and supplies the white light as backlight to a liquid crystal display (LCD). LCDs using such a QD-LED backlight has high potential as new displays, since the characteristics of these LCDs include superior color reproduction unlike those using a traditional backlight using LEDs only, ability to realize full color comparable to that of LEDs, and lower fabrication costs and higher productivity than LED TVs.

In the related art, a method of fabricating such a QD-LED includes: forming a QD sheet by mixing a QD with polymer; and subsequently coating the QD sheet with a plurality of barrier layers in order to protect the sheet surface from outside moisture or the like and maintain the lifespan. However, this related-art method is problematic in that fabrication costs are expensive due to the barrier layers having to be applied several times, and most of all, this method fails to entirely protect the QD from the external environment.

In addition, another method used in related art includes: etching a glass surface to a certain depth; inputting a QD into the etched portion of the glass surface; covering the resultant structure with a cover glass; applying low melting point glass on the peripheries; sintering the applied low melting point glass; and sealing the resultant structure using a laser beam. However, the etching process causes fabrication costs to be expensive. In particular, it is difficult to use a thin glass plate.

Related Art Document

Patent Document 1: Korean Patent Application No. 10-2012-0009315 (Feb. 1, 2012)

BRIEF SUMMARY OF THE INVENTION

Various aspects of the present invention provide a color conversion substrate for a light-emitting diode (LED) and a method of fabricating the same able to form a hermetic seal, entirely protect a quantum dot accommodated in the LED from the external environment, and improve luminous efficiency of the LED.

In an aspect of the present invention, provided is a color conversion substrate for an LED including: a first glass substrate disposed over the LED; a second glass substrate facing the first glass substrate; a structural body disposed between the first glass substrate and the second glass substrate, the structural body having an opening, and being formed of a material, the coefficient of thermal expansion (CTE) of which ranges from to $30*10^{-7}/°$ C. to $80*10^{-7}/°$ C.; a quantum dot accommodated in the opening of the structural body; and an sealant disposed between the first glass substrate and a bottom surface of the structural body and between the second glass substrate and a top surface of the structural body.

According to an embodiment of the invention, the structural body may be white.

The structural body may be formed of one selected from the group consisting of cordierite, alumina, and willemite.

The structural body may be formed of a glass material containing a white pigment.

The sealant may be formed of a glass frit, the softening point of which is lower than the softening point of the first glass substrate and the second glass substrate.

In addition, the sealant may contain a black pigment.

In an aspect of the present invention, provided is a method of fabricating a color conversion substrate for an LED. The method includes: forming a structural body having an opening, the CTE of the structural body ranging from to $30*10^{-7}/°$ C. to $80*10^{-7}/°$ C.; forming an sealant on a top surface and a bottom surface of the structural body; disposing the structural body having the sealant on a first glass substrate and subsequently inputting a quantum dot into the opening of the structural body; and laser-sealing the first glass substrate and the structural body to each other and a second glass substrate and the structural body to each other by disposing the second glass substrate on the structural body in which the quantum dot is accommodated such that the second glass substrate faces the first glass substrate, and subsequently irradiating a laser beam onto the sealant.

In an aspect of the present invention, provided is a method of fabricating a color conversion substrate for an LED. The method includes: forming a structural body having an opening, the CTE of the structural body ranging from $30*10^{-7}/°$ C. to $80*10^{-7}/°$ C.; forming an sealant on a top surface of a first glass substrate and a bottom surface of a second glass substrate, the sealant having a shape corresponding to a shape of contact surfaces of the structural body; disposing the structural body on the top surface of the glass substrate on which the sealant is formed such that the structural body adjoins the sealant and subsequently inputting a quantum dot into the opening of the structural body; and laser-sealing the first glass substrate and the structural body to each other and the first glass substrate and the structural body to each other by disposing the second glass substrate on the structural body in which the quantum dot is accommodated such that the second glass substrate faces the first glass substrate such that the sealant on the bottom surface of the second glass substrate adjoins the structural body and subsequently irradiating a laser beam onto the sealant.

According to an embodiment of the invention, the operation of forming the structural body may include shaping and sintering a powder material formed of a ceramic material or a glass material.

The operation of forming the structural body may include shaping and sintering a powder material formed of one selected from the group consisting of cordierite, alumina, and willemite.

The operation of forming the structural body may include shaping and sintering a glass powder material containing a white pigment.

At the operation of forming the sealant, a glass frit, the softening point of which is lower than the softening point of the first glass substrate and the second glass substrate, may be used as the sealant.

The operation of forming the sealant may include adding a black pigment to the sealant.

In addition, the operation of forming the structural body may include forming a plurality of the structural bodies. The method may further include, after the plurality of the structural bodies is disposed between the first glass substrate and the second glass substrate that face each other by carrying out the step of forming the sealant, the step of inputting the quantum dot, and the step of laser-sealing, for each of the plurality of the structural bodies, dicing the first glass substrate and the second glass substrate into cells, each of which is defined by a corresponding one of the plurality of the structural bodies.

According to the present invention as set forth above, the sealant formed of a low melting point glass frit is applied on the top surface and the bottom surface of the structural body having the opening in which the QD is to be accommodated and subsequently is temporarily sintered before the sealant is laser-sealed to the substrates disposed on the top surface and the bottom surface of the structural body. This can consequently provide the color conversion substrate for an LED with a hermetic seal, thereby entirely protecting the QD accommodated in the structural body from the external environment.

In addition, according to the present invention, the fabrication and use of the white structural body formed of a ceramic material enables light emitted sideways by the QD such that the reflected light to be reflected forward, thereby improving the luminous efficiency of the LED.

Furthermore, according to the present invention, related-art processing, such as multilayer coating intended to protect the QD or etching, is omitted. It is therefore possible to reduce fabrication costs compared to that of the related art and remove limitations in the thickness of the substrate. In particular, since the structural body is manufactured by powder compaction, the structural body can be mass-produced at a lower cost.

DETAILED DESCRIPTION OF THE INVENTION

Figure 1:
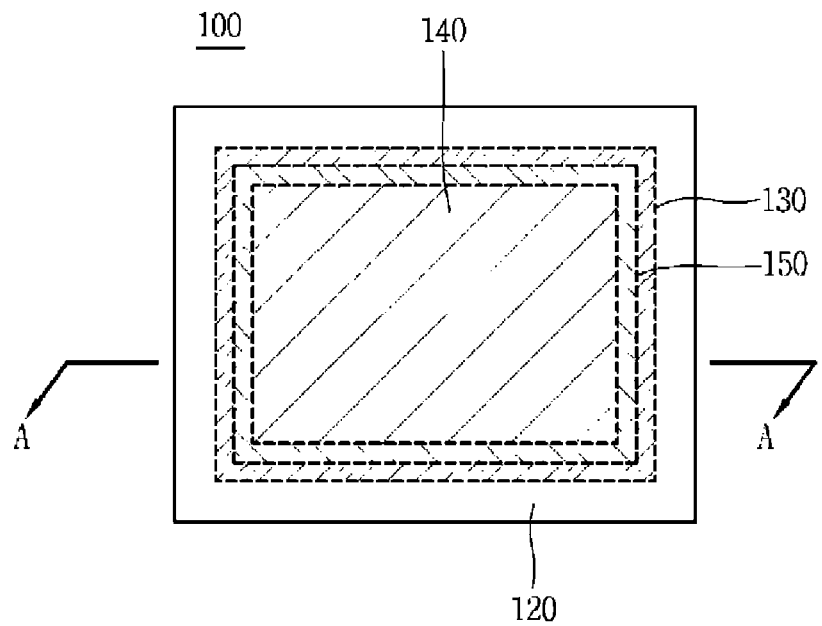
FIG. 1 is a top plan view illustrating a color conversion substrate for an LED according to an exemplary embodiment of the present invention.

Reference will now be made in detail to a color conversion substrate for a light-emitting diode (LED) and a method of fabricating the same according to the present invention, embodiments of which are illustrated in the accompanying drawings and described below, so that a person skilled in the art to which the present invention relates could easily put the present invention into practice.

Throughout this document, reference should be made to the drawings, in which the same reference numerals and symbols are used throughout the different drawings to designate the same or similar components. In the following description of the present invention, detailed descriptions of known functions and components incorporated herein will be omitted in the case that the subject matter of the present invention is rendered unclear.

Figure 2:
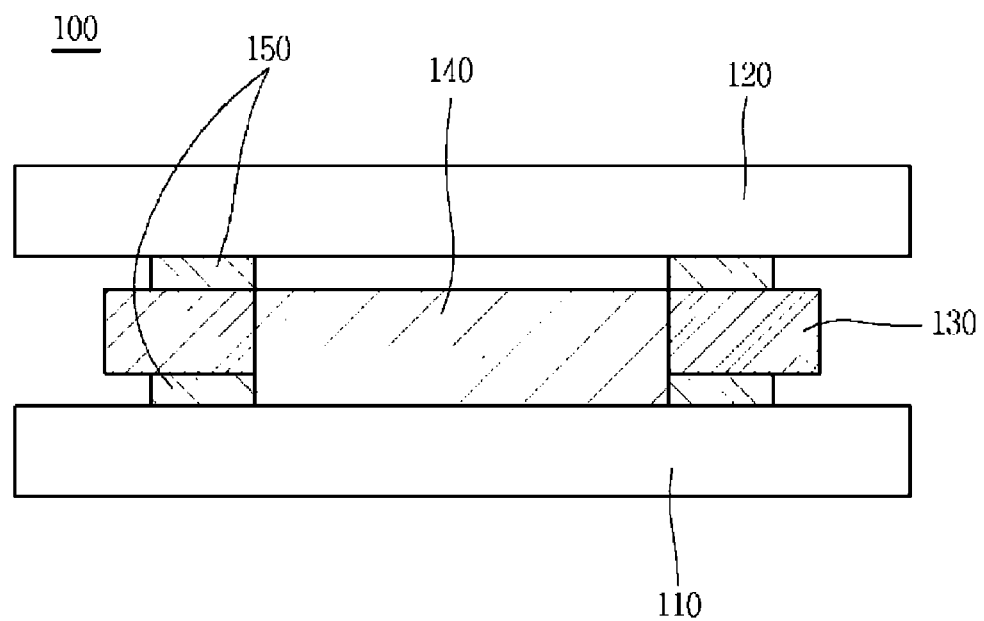
FIG. 2 is a cross-sectional view taken along line A-A in FIG. 1.

As illustrated in FIG. 1 and FIG. 2, a color conversion substrate for an LED (hereinafter referred to as "LED color conversion substrate" or "color conversion substrate") 100 according to an exemplary embodiment is a substrate that is disposed on an LED, encapsulating the LED, and converts the color of a portion of light emitted by the LED. Consequently, an LED package including the color conversion substrate 100 and the LED radiates white light in which, for example, blue light emitted by a blue LED and color-converted light from the color conversion substrate 100 are mixed. Although not illustrated in the drawings, the LED includes a body and an LED chip. The body of the LED is a structure having an opening of a predetermined shape, providing a structural space in which the LED chip is mounted. The body has wires and a lead frame by which the LED chip is electrically connected to an external power source. In addition, the LED chip is mounted on the body, is connected to the external power source via the wires and the lead frame, and serves as a light source emitting light using an external current. The LED chip is implemented as a forward junction of an n-semiconductor layer that provides electrons and a p-semiconductor layer that provides holes.

The color conversion substrate 100 according to this embodiment disposed on the LED as above includes a first glass substrate 110, a second glass substrate 120, a structural body 130, a quantum dot (QD) 140, and an sealant 150.

The first glass substrate 110 is the portion of the color conversion substrate 100 that is disposed adjacent to the LED. The second glass substrate 120 is disposed to face the first glass substrate 110, and is the portion of the color conversion substrate 100 that is disposed farthest from the LED. That is, the first glass substrate 110 and the second glass substrate 120 are spaced apart from each other by means of the structural body 130, the QD 140 and the sealant 150 sandwiched therebetween, such that the first glass substrate 110 and the second glass substrate 120 face each other. The first glass substrate 110 and the second glass substrate 120 act as paths through which light emitted by the LED radiates outward while protecting the QD 140 from the external environment. For this, the first glass substrate 110 and the second glass substrate 120 may be formed of transparent glass substrates. It is preferable that the coefficient of thermal expansion (CTE) of the first glass substrate 110 and the second glass substrate 120 is equal or similar to the CTE of the composition of the sealant 150. This feature enables a hermetic seal to be formed between the first and second glass substrates 110 and 120 and the sealant 150 by laser sealing. It is preferable that the softening point of the first glass substrate 110 and the second glass substrate 120 is higher than the softening point of the sealant 150. This feature is intended to prevent the first glass substrate 110 and the second glass substrate 120 from being transformed while sintering is being carried out to form the sealant 150. According to this embodiment of the present invention, the first glass substrate 110 and the second glass substrate 120 may be formed of borosilicate glass or soda lime glass. This requires the sealant 150 to be formed of a material, the CTE of which is equal or similar to that of the first glass substrate 110 and the second glass substrate 120, and the softening point of which is lower than that of the first glass substrate 110 and the second glass substrate 120. These properties of the sealant 150 will be described in detail later.

The structural body 130 is disposed between the first glass substrate 110 and the second glass substrate 120. The structural body 130 has an opening in which the QD 140 is accommodated, the opening being defined in the central portion of the structural body 130. As illustrated in FIG. 1 and FIG. 2, the structural body 130 is substantially in the shape of an oblong frame. According to this embodiment of the present invention, the structural body 130 is formed of a material, the CTE of which ranges from $30*10^{-7}/°$ C. to $80*10^{-7}/°$ C., such that the structural body 130 can provide a hermetic seal by laser sealing with the sealant 150. In addition, the structural body 130 may be white in order to reflect light emitted sideways by the QD 140 accommodated in the opening such that the reflected light is directed forward, thereby improving the luminous efficiency of the LED. According to this embodiment of the present invention, the structural body 130 may be formed of a white ceramic material, the CTE of which ranges from $30*10^{-7}/°$ C. to $80*10^{-7}/°$ C., for example, cordierite, alumina, or willemite. In addition, the structural body 130 may be formed of a glass containing a white pigment. The CTE of the glass ranges from $30*10^{-7}/°$ C. to $80*10^{-7}/°$ C. The structural body 130 may be fabricated by powder compaction, which will be described in greater detail later.

The QD 140 is accommodated within the opening of the structural body 130. The QD 140 is hermetically encapsulated by the first glass substrate 110, the second glass substrate 120, the structural body 130, and the sealant 150, which are laser sealed. In this manner, the QD 140 can be entirely protected from the external environment. The QD 140 is a nano-crystal material of semiconductor, the diameter of which approximately ranges from 1 to 10 nm, and that has a quantum confinement effect. The QD 140 converts the wavelength of light emitted by the LED, thereby generating wavelength-converted light, or fluorescent light. According to this embodiment of the present invention, the LED is implemented as a blue LED, and the QD 140 is formed of a QD material able to wavelength-convert a portion of light emitted by the blue LED to yellow light in order to produce white light by mixing the yellow light with the blue light.

The sealant 150 is formed between the first glass substrate 110 and the bottom surface of the structural body 130 and between the second glass substrate 120 and the top surface structural body 130. With this configuration, due to a sealing process of irradiating a laser beam onto the sealant 150, the QD 140 can be provided with a hermetic seal by the first glass substrate 110 and the structural body 130 and by the second glass substrate 120 and the structural body 130, thereby being entirely protected from the external environment. According to this embodiment of the present invention, the sealant 150 may be formed of a low melting point glass frit. The sealant 150 may be formed of a glass frit, the CTE of which is equal or similar to the CTE of the first glass substrate 110, the second glass substrate 120, or the structural body 130, such that laser sealing is enabled. In addition, it is preferable that the sealant 150 is formed of a glass frit, the softening point of which is lower than the softening point of the first glass substrate 110 and the second glass substrate 120, in order to prevent the first glass substrate 110 and the second glass substrate 120 from being transformed while sintering is being carried out to form the sealant 150 on the first glass substrate 110 and the second glass substrate 120. For example, the sealant 150 may be formed of a $V_2O_5$—$P_2O_5$ based glass frit or a $Bi_2O_3$—$B_2O_3$—$ZnO$ based glass frit that has superior ability to absorb laser light having a wavelength ranging from 800 to 900 nm. In order to further improve the laser light absorption, the composition of the sealant 150 may include a black pigment. The black pigment included in the sealant 150 may be implemented as a $MnO_2$—$Fe_2O_3$ based material, and the content of the black pigment may range, by weight, from 2% to 10% of the sealant 150. When the content of the black pigment exceeds 10% by weight, the physical properties of the sealant 150 change. When the content of the black pigment is less than 2% by weight, the absorption of laser light within the above-stated wavelength range, i.e. infrared (IR) range, is reduced. In this case, hermetic sealing becomes difficult.

A description of an LED color conversion substrate according to another exemplary embodiment of the invention will be given below with reference to FIG. 3 and FIG. 4.

Figure 3:
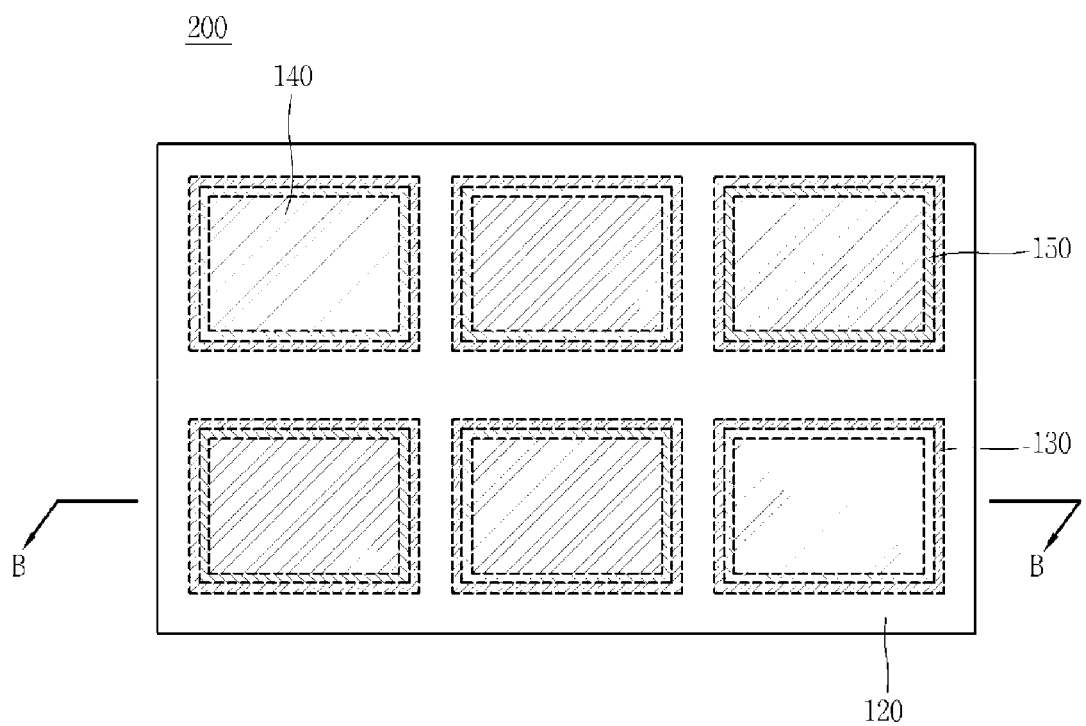
FIG. 3 is a top plan view illustrating a color conversion substrate for an LED according to another exemplary embodiment of the present invention.
Figure 4:
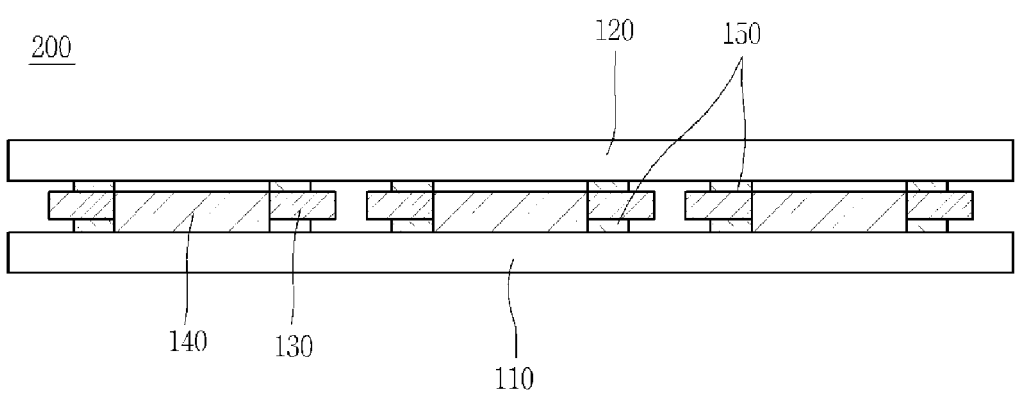
FIG. 4 is a cross-sectional view taken along line B-B in FIG. 3.

FIG. 3 is a top plan view illustrating an LED color conversion substrate according to this embodiment of the present invention, and FIG. 4 is a cross-sectional view taken along line B-B in FIG. 3.

As illustrated in FIG. 3 and FIG. 4, the LED color conversion substrate 200 according to this embodiment is configured such that a plurality of structural bodies 130 is disposed between a first substrate 110 and a second substrate 120 facing the first substrate 110. This embodiment differs from the former embodiment only in the number of the structural bodies 130 and the resultant number of QDs 140. Therefore, detailed descriptions of the components of this embodiment will be omitted since they are identical to those of the former embodiment.

The color conversion substrate 200 having this structure may be a substrate applicable to a plurality of LEDs that is used as a backlight source of a large display or a light source of a wide area lighting apparatus, or may be a bulk substrate that is supposed to be divided into cells, each of which is based on or defined by a single one of the structural bodies 130, and is applied to a corresponding one of the same number of LEDs.

Like the LED color conversion substrate 100 according to the former embodiment, the LED color conversion substrate 200 according to this embodiment includes the first glass substrate 110 and the second glass substrate 120 facing each other, the plurality of structural bodies 130 disposed between the first and second glass substrate 110 and 120, the CTE of the structural bodies 130 ranging from $30^{-7}/°$ C. to $80*10^{-7}/°$ C., the plurality of QDs 140 respectively accommodated in the openings of the structural bodies 130, and an sealant 150 disposed between the first glass substrate 110 and the structural bodies 130 and between the structural bodies 130 and the second glass substrate 120. When laser sealing is performed, the sealant 150 serves as a medium that bonds the first glass substrate 110 and the structural bodies 130 to each other and the structural bodies 130 and the second glass substrate 120 to each other. In this manner, a hermetic seal for the QDs 140 is provided, thereby entirely protecting the QDs from the external environment. In particular, the structural bodies 130 are formed white in order to reflect light emitted sideways from the QDs such that the reflected light is directed forward, thereby improving the luminous efficiency of the LED.

A description of a method of fabricating an LED color conversion substrate according to an exemplary embodiment of the invention will be given below with reference to FIG. 5 to FIG. 10.

Figure 5:
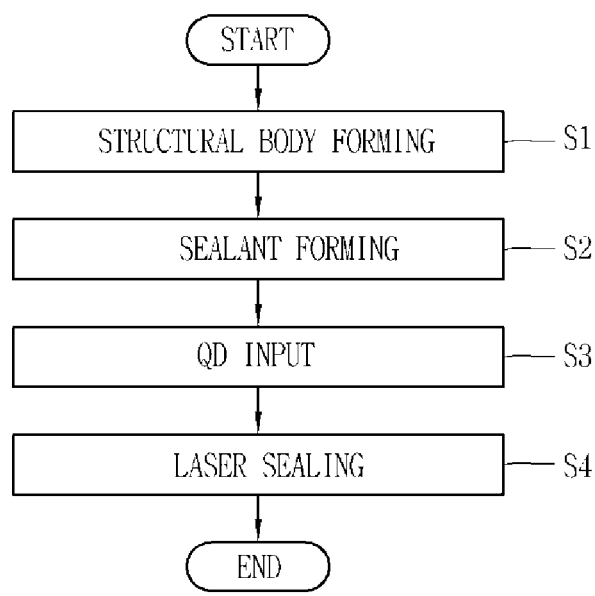
FIG. 5 is a process flowchart illustrating a color conversion substrate for an LED according to another exemplary embodiment of the present invention.

Referring to FIG. 5, the method of fabricating the LED color conversion substrate according to this embodiment includes a structural body forming step S1, an sealant forming step S2, a QD input step S3, and a laser sealing step S4. In the following description of the method of fabricating an LED color conversion substrate according to this embodiment, the LED color conversion substrate will be illustrated as being an LED color conversion substrate applicable for a backlight source of a display or a light source of a wide area lighting apparatus.

Figure 6:
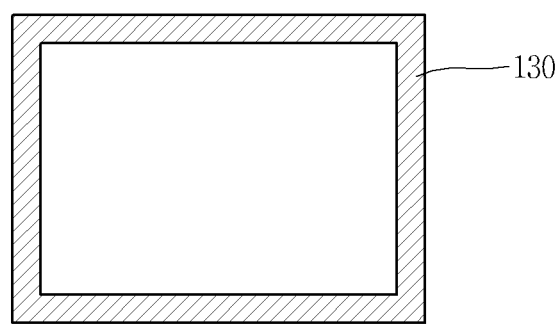
FIG. 6 to FIG. 10 are process views sequentially illustrating the operations of a method of fabricating a color conversion substrate for an LED according to an exemplary embodiment of the present invention.

First, as illustrated in FIG. 6, the structural body forming step S1 forms a structural body 130 having an opening, with the CTE of which ranges from $30*10^{-7}/°$ C. to $80*10^{-7}/°$ C. The structural body forming step S1 includes forming granules from powder of a ceramic material or a glass material and subsequently forming the structural body 130 having an opening by shaping and sintering the granules, the structural body 130 being in the shape of an oblong frame. For example, the structural body forming step S1 may form the structural body 130 by shaping and sintering powder formed of one of white cordierite, alumina, and willemite, or may form the structural body 130 by shaping and sintering glass powder to which a white pigment is added.

Figure 7:
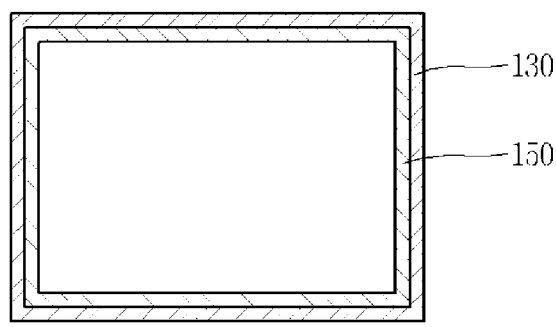

Afterwards, as illustrated in FIG. 7, the sealant forming step S2 forms an sealant 150 on the top surface and the bottom surface of the structural body 130. At the sealant forming step S2, the sealant 150 formed of a low melting point glass frit in the shape of paste is applied on the top surface and the bottom surface of the structural body 130 and subsequently is sintered. Here, the sealant 150 is formed of the low melting point glass frit, the softening point of which is lower than the softening point of a first glass substrate 110 and a second glass substrate 120 that is to be bonded to the structural body 130 by means of the sealant 150. For example, the sealant forming step S2 may use a $V_2O_5$—$P_2O_5$ based glass frit or a $Bi_2O_3$—$B_2O_3$—$ZnO$ based glass frit as the sealant 150. In addition, at the sealant forming step S2, a black pigment formed of a $MnO_2$—$Fe_2O_3$ based material may be added to the sealant 150 in order to further improve the laser light absorption in the IR range of the sealant 150.

Figure 8:
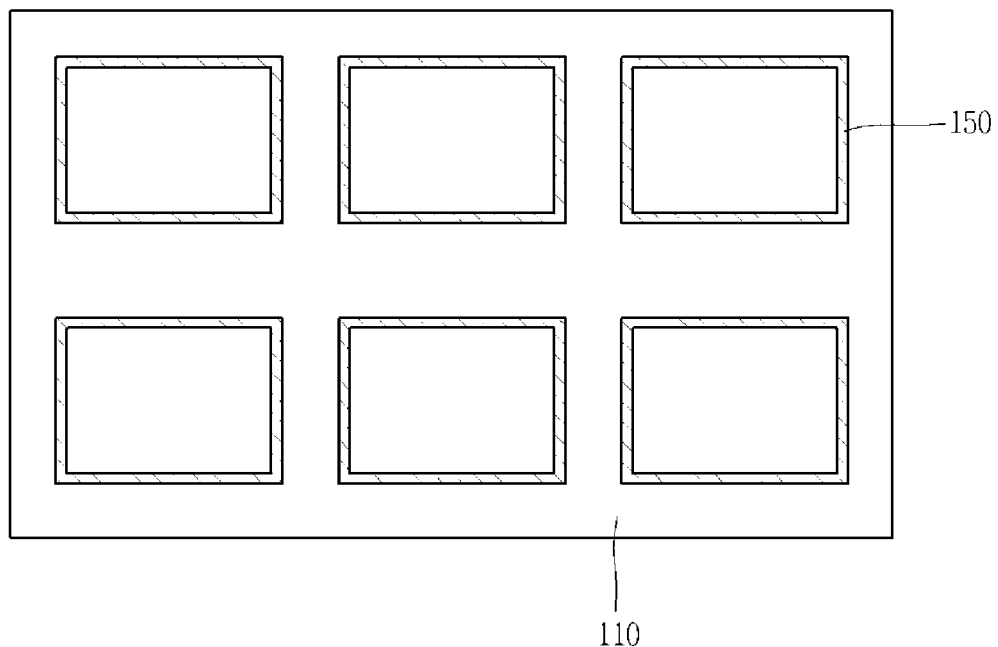

In addition, as illustrated in FIG. 8, as an alternative, the sealant forming step S2 may form the sealant 150 on one surface of each of the first glass substrate 110 and the second glass substrate 120 that adjoins the structural bodies 130. Specifically, the sealant forming step S2 includes applying a paste of a low melting point glass frit on one surface of each of the first glass substrate 110 and the second glass substrate 120, in the shape corresponding to the contact surfaces of the structural bodies 130, and subsequently temporarily sintering the paste. Here, the operation of applying the paste is performed by printing.

Figure 9:
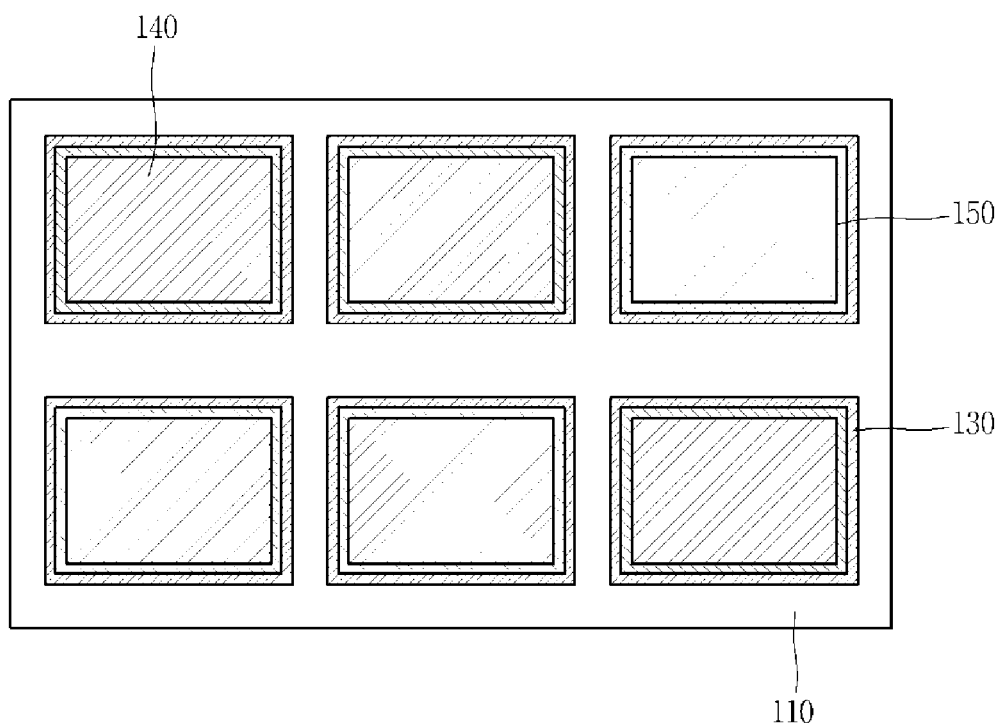

Thereafter, as illustrated in FIG. 9, the QD input step S3 inputs a QD into each opening of the structural bodies 130. Specifically, after the plurality of structural bodies 130 on which the sealant 150 is disposed is disposed on the first glass substrate 110 or the plurality of structural bodies 130 is disposed on the top surface of the first glass substrate 110 on which the sealant 150 is disposed such that the plurality of structural bodies 130 adjoins the sealant 150, a QD 140 wavelength-converting a portion of light emitted by a blue diode into yellow light is input into each opening of the plurality of structural bodies 130.

Figure 10:
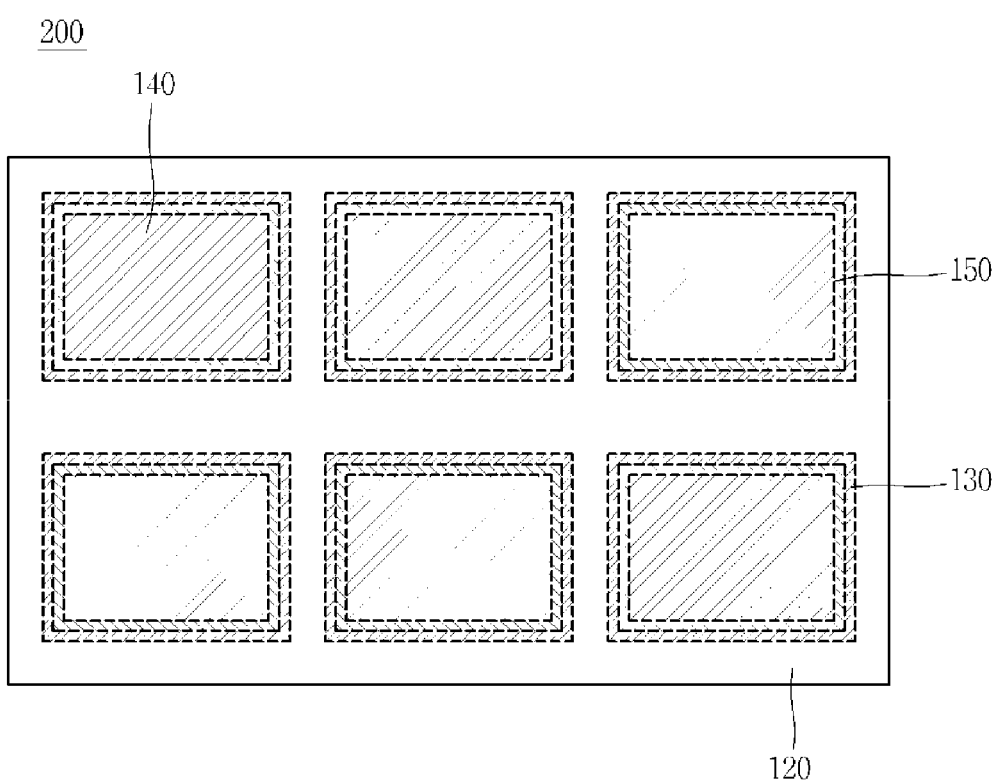

Finally, as illustrated in FIG. 10, the laser sealing step S4 seals the first glass substrate 110 and structural bodies 130 to each other and the second glass substrate 120 and the structural bodies 130 to each other by means of the sealant 150 by irradiating a laser beam onto the sealant 150. At the laser sealing step S4, when the sealant 150 is formed on the top surfaces and the bottom surfaces of the structural bodies 130, a laser beam may be irradiated onto the sealant 150 after the second glass substrate 120 is disposed on the plurality of structural bodies 130 in which the QD 140 is accommodated such that the second glass substrate 120 faces the first glass substrate 110. Alternatively, when the sealant 150 is formed on the first glass substrate 110 and the second glass substrate 120, a laser beam may be irradiated onto the sealant 150 after the second glass substrate 120 on the bottom surface of which the sealant 150 is formed is disposed on the plurality of structural bodies 130 such that the sealant 150 adjoins the top surface of the plurality of structural bodies 130.

When the laser sealing step S4 is completed as above, the LED color conversion substrate 200 according to another embodiment of the present invention is fabricated. When the LED color conversion substrate 200 is fabricated by the fabrication method according to an embodiment of the invention, a related-art multilayer coating process intended to protect the QD is omitted, thereby reducing fabrication costs compared to that of the related art. In addition, a related-art etching coating process required for the accommodation of the QD is omitted, whereby limitations in the thickness of the substrate are removed. In particular, since the structural bodies 130 are manufactured by powder compaction, the structural bodies 130 can be mass-produced at a lower cost.

The color conversion substrate 200 fabricated by the fabrication method according to an embodiment of the invention is applicable for a backlight source of a display or a light source of a wide area lighting apparatus. In addition, the color conversion substrate 200 may be divided into a plurality of cells, each of which is used as an LED color conversion substrate (see 100 in FIG. 1). For this purpose, the process of dicing the color conversion substrate 200 produced by the method of fabricating an LED color conversion substrate according to an embodiment of the invention into the cells, each of which is defined by the corresponding structural body 130, may be performed additionally. As set forth above, according to an embodiment of the invention, it is possible to facilitate the mass production of the color conversion substrate (100 in FIG. 1) applicable to an individual LED by fabricating the bulk color conversion substrate 200 to be divided into a plurality of cells and subsequently dicing the bulk color conversion substrate 200 into the plurality of cells.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

EXPLANATION OF REFERENCE NUMERALS 100, 200: color conversion substrate,
110: first glass substrate,
120: second glass substrate,
130: structural body,
140: QD, 150: sealant

What is claimed is:

1. A color conversion substrate for a light-emitting diode comprising:
   a first glass substrate disposed over the light-emitting diode;
   a second glass substrate facing the first glass substrate;
   a structural body disposed between the first glass substrate and the second glass substrate, the structural body having an opening, and comprising a material, a coefficient of thermal expansion of which ranges from to $30*10^{-7}/°$ C. to $80*10^{-7}/°$ C.;
   a quantum dot accommodated in the opening of the structural body; and
   an sealant disposed between the first glass substrate and a bottom surface of the structural body and between the second glass substrate and a top surface of the structural body.

2. The color conversion substrate according to claim 1, wherein the structural body is white.

3. The color conversion substrate according to claim 2, wherein the structural body comprises one selected from the group consisting of cordierite, alumina, and willemite.

4. The color conversion substrate according to claim 2, wherein the structural body comprises a glass material containing a white pigment.

5. The color conversion substrate according to claim 1, wherein the sealant comprises a glass frit, a softening point of which is lower than a softening point of the first glass substrate and the second glass substrate.

6. The color conversion substrate according to claim 5, wherein the sealant contains a black pigment.

7. A method of fabricating a color conversion substrate for a light-emitting diode, comprising:
   forming a structural body having an opening, a coefficient of thermal expansion of the structural body ranging from to $30*10^{-7}/°$ C. to $80*10^{-7}/°$ C.;
   forming an sealant on a top surface and a bottom surface of the structural body;
   disposing the structural body having the sealant on a first glass substrate and subsequently inputting a quantum dot into the opening of the structural body; and
   laser-sealing the first glass substrate and the structural body to each other and a second glass substrate and the structural body to each other by disposing the second glass substrate on the structural body in which the quantum dot is accommodated such that the second glass substrate faces the first glass substrate, and subsequently irradiating a laser beam onto the sealant.

8. The method according to claim 7, wherein forming the structural body comprises shaping and sintering a powder material comprising a ceramic material or a glass material.

9. The method according to claim 8, wherein the powder material comprises one selected from the group consisting of cordierite, alumina, and willemite.

10. The method according to claim 8, wherein the powder material comprises a glass powder material containing a white pigment.

11. The method according to claim 7, wherein, at the step of forming the sealant, a glass frit, a softening point of which is lower than a softening point of the first glass substrate and the second glass substrate, is used as the sealant.

12. The method according to claim 11, wherein forming the sealant comprises adding a black pigment to the sealant.

13. The method according to claim 7,
   wherein forming the structural body comprises forming a plurality of the structural bodies, and
   wherein the method further comprises,
   after the plurality of the structural bodies is disposed between the first glass substrate and the second glass substrate that face each other by carrying out the step of forming the sealant, the step of inputting the quantum dot, and the step of laser-sealing, for each of the plurality of the structural bodies, dicing the first glass substrate and the second glass substrate into cells, each of which is defined by a corresponding one of the plurality of the structural bodies.

14. A method of fabricating a color conversion substrate for a light-emitting diode, comprising:
    forming a structural body having an opening, a coefficient of thermal expansion of the structural body ranging from $30*10^{-7}/°$ C. to $80*10^{-7}/°$ C.;
    forming an sealant on a top surface of a first glass substrate and a bottom surface of a second glass substrate in a shape corresponding to a shape of contact surfaces of the structural body with which the sealant will come into contact;
    disposing the structural body on the top surface of the glass substrate on which the sealant is formed such that the structural body comes into contact with the sealant and subsequently inputting a quantum dot into the opening of the structural body; and
    laser-sealing the first glass substrate and the structural body to each other and the first glass substrate and the structural body to each other by disposing the second glass substrate on the structural body in which the quantum dot is accommodated such that the second glass substrate faces the first glass substrate and the sealant on the bottom surface of the second glass substrate comes into contact with the structural body and subsequently irradiating a laser beam onto the sealant.

15. The method according to claim 14, wherein forming the structural body comprises shaping and sintering a powder material comprising a ceramic material or a glass material.

16. The method according to claim 14, wherein, at the step of forming the sealant, a glass frit, a softening point of which is lower than a softening point of the first glass substrate and the second glass substrate, is used as the sealant.

17. The method according to claim 14,
    wherein forming the structural body comprises forming a plurality of the structural bodies, and
    wherein the method further comprises,
    after the plurality of the structural bodies is disposed between the first glass substrate and the second glass substrate that face each other by carrying out the step of forming the sealant, the step of inputting the quantum dot, and the step of laser-sealing, for each of the plurality of the structural bodies,
    dicing the first glass substrate and the second glass substrate into cells, each of which is defined by a corresponding one of the plurality of the structural bodies.

* * * * *